US006890184B2

(12) United States Patent
Doblar et al.

(10) Patent No.: US 6,890,184 B2
(45) Date of Patent: May 10, 2005

(54) ELECTRICAL CONNECTOR FOR CONVEYING SIGNALS BETWEEN TWO CIRCUIT BOARDS

(75) Inventors: Drew G. Doblar, San Jose, CA (US); Han Y. Ko, Milipitas, CA (US); Stephen K. Gee, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 12 days.

(21) Appl. No.: 10/411,612

(22) Filed: Apr. 10, 2003

(65) Prior Publication Data

US 2004/0203259 A1 Oct. 14, 2004

(51) Int. Cl.[7] .............................................. H01R 12/00
(52) U.S. Cl. ...................... 439/65; 361/745; 361/792
(58) Field of Search ........................ 439/65, 55, 68, 439/74; 361/745, 792

(56) References Cited

U.S. PATENT DOCUMENTS

| | | | | |
|---|---|---|---|---|
| 5,017,146 A | * | 5/1991 | Uehara et al. ................ 439/65 |
| 5,210,680 A | | 5/1993 | Scheibler .................... 361/384 |
| 5,429,521 A | * | 7/1995 | Morlion et al. ............. 439/108 |
| 5,472,354 A | * | 12/1995 | Chen et al. ................. 439/357 |
| 5,500,788 A | * | 3/1996 | Longueville et al. ....... 361/800 |
| 5,588,844 A | * | 12/1996 | Sipe ............................. 439/65 |
| 6,421,215 B1 | | 7/2002 | Bushue ...................... 361/93.1 |
| 6,422,876 B1 | | 7/2002 | Fitzgerald et al. ............ 439/61 |
| 6,485,309 B2 | | 11/2002 | Edholm ........................ 439/61 |
| 6,574,695 B1 | | 6/2003 | Mott et al. .................. 710/302 |
| 6,574,748 B1 | | 6/2003 | Andress et al. ............... 714/11 |
| 6,690,584 B2 | * | 2/2004 | Uzuka et al. ............... 361/796 |
| 6,768,640 B2 | | 7/2004 | Doblar et al. ............... 361/695 |
| 2004/0001303 A1 | | 1/2004 | Doblar et al. ............... 361/601 |
| 2004/0001311 A1 | | 1/2004 | Doblar et al. ............... 361/687 |
| 2004/0002237 A1 | | 1/2004 | Doblar et al. ................. 439/74 |

FOREIGN PATENT DOCUMENTS

JP            402288175 A    * 11/1990

OTHER PUBLICATIONS

"Virtual Midplane Realizes Ultrafast Card Interconnects"; Electronic Design (ED Online ID #1771); Dec. 9, 2002; Michael Fowler; Copyright © 2004; Penton Media, Inc.

* cited by examiner

*Primary Examiner*—Michael C. Zarroli
(74) *Attorney, Agent, or Firm*—Meyertons Hood Kivlin Kowert & Goetzel, P.C.; B. Noël Kivlin; Stephen J. Curran

(57) ABSTRACT

An electrical connector for conveying signals between two circuit boards includes a first connector portion including a first array of board contacts for connection to a first corresponding footprint on a first circuit board. The connector also includes a second connector portion including a second array of board contacts for connection to a second corresponding footprint on a second circuit board. The signals include a plurality of signal groups each including a different plurality of related signals. Each of the signal groups is assigned to a grouping of related board contacts of the first array and to a corresponding grouping of related board contacts of the second array. When the first connector portion and the second connector portion are mated, each grouping of board contacts of the first array is electrically coupled to the corresponding grouping of board contacts in a transposed location in the second array.

21 Claims, 4 Drawing Sheets

*FIG. 3*

ELECTRICAL CONNECTOR FOR CONVEYING SIGNALS BETWEEN TWO CIRCUIT BOARDS

BACKGROUND OF THE INVENTION

1. Field of the Invention

This invention relates to electronic system connections and, more particularly, to connectors between circuit boards.

2. Description of the Related Art

Connections between two circuit boards of an electrical or electronic system are typically carried out by one or more types of connectors. A connector may include a pair of mating parts each having one or more signal connection components. In one type of connector, the signal connections may be pins. In another type of connector, the signal connections may be finger contacts for example. Depending on the application, other styles of connections may be suitable.

In many applications, one half of the connector pair may be mounted to one circuit board, while the other half may be mounted to another circuit board. The connectors may be mounted using various well-known methods such as soldering, for example. In one type of connector, each signal connection may be soldered to a board connection point or pad that has been manufactured on the circuit board. Some circuit boards may use through-hole connections for mounting the connectors, while others may use surface mount techniques. In either case, the connection point may have one or more signal wires or traces which are routed from the connection point to other places on the circuit board.

When mating two circuit boards together in the same plane, each of the halves of the connector pair may be mounted to an edge of a circuit board such that the boards may be mated together in the same plane. This type of mating may require no special routing or pin assignment. However, in situations where the two circuit boards being mated are not positioned in the same plane, it may be desirable to assign signals to connector contacts which may provide less signal degradation.

SUMMARY OF THE INVENTION

Various embodiments of an electrical connector for conveying signals between two circuit boards are disclosed. In one embodiment, an electrical connector includes a first connector portion including a first array of board contacts for connection to a first corresponding footprint on a first circuit board. The connector also includes a second connector portion including a second array of board contacts for connection to a second corresponding footprint on a second circuit board. The signals may include a plurality of signal groups each including a different plurality of related signals. Each of the plurality of signal groups may be assigned to a grouping of related board contacts of the first array of board contacts and to a corresponding grouping of related board contacts of the second array of board contacts. When the first connector portion and the second connector portion are mated together, each grouping of related board contacts of the first array may be electrically coupled to the corresponding grouping of related board contacts in a transposed location in the second array.

BRIEF DESCRIPTION OF THE DRAWINGS

FIG. 3 is a diagram of one embodiment of the pin assignments for the board contacts of connector portions 100A and 100B of connector 100 of FIG. 1 and FIG. 2.

Figure 1:
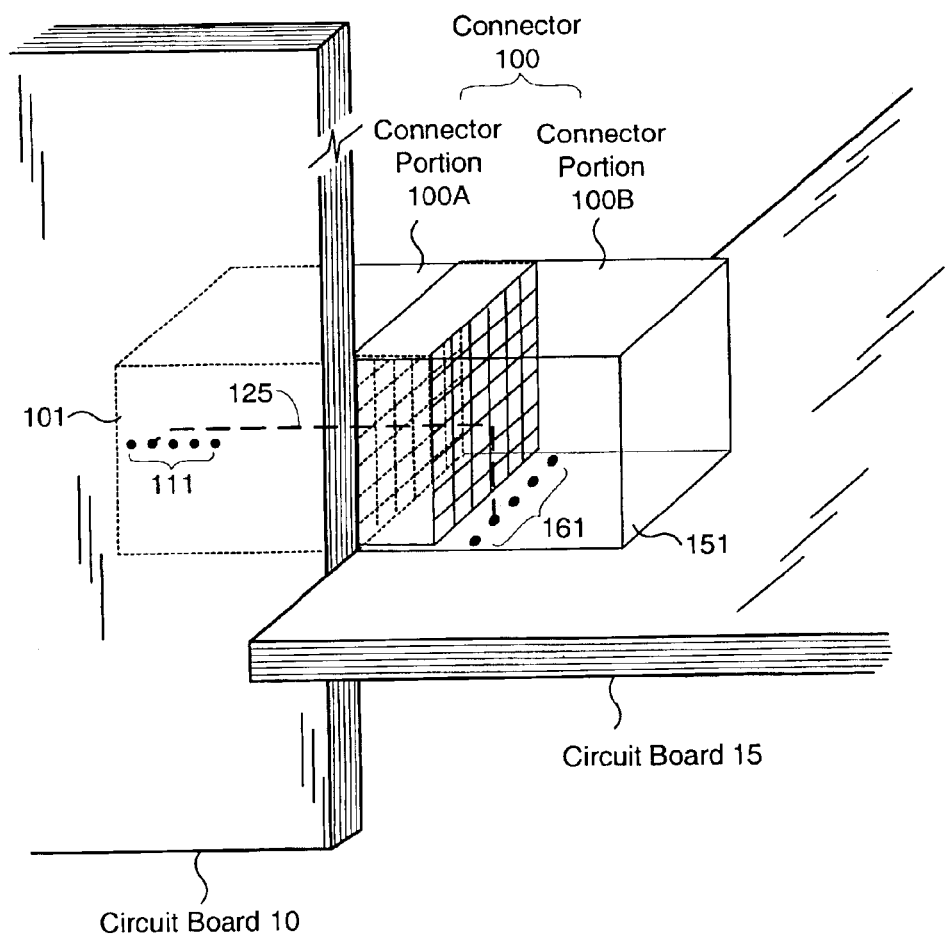
FIG. 1 is a perspective view diagram of two circuit boards detachably mated together by one embodiment of a connector.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning now to FIG. 1, a perspective view diagram of two circuit boards detachably mated together by one embodiment of a connector is shown. Connector 100 is configured to convey electrical signals including power and ground between circuit board 10 and circuit board 15. Connector 100 includes two portions: connector portion 100A and connector portion 100B. Connector portion 100A and 100B each include multiple internal connections such as internal connection 125, for example. The connections that are used to mate each connector portion together are herein referred to as connector contacts and the connections used to connect each connector portion to the respective circuit board are herein referred to as board contacts. In one embodiment, the board contacts 111 of connector portion 110A may be mounted to signal pads or other suitable connections on surface 101 of circuit board 10 using any suitable mounting technique. The board contacts 161 of connector portion 1001B may also be mounted to signal pads or other suitable connections on surface 151 of circuit board 15 using any suitable mounting technique. Each of connector portions 100A and 100B may be physically arranged along one edge and mounted to one side of circuit board 10 and circuit board 15, respectively. As shown, connector portion 100A and connector portion 100B are detachably mated together such that the boards are positioned edge to edge in a substantially orthogonal orientation with respect to each other.

It is noted that circuit board 10 and circuit board 15 are shown having multiple layers, although it is contemplated that other embodiments may use a single layer, two-sided circuit board. A layer may include signal traces and or power and ground planes. As will be described in greater detail below, the signal pads may be connections known as "vias". The vias may connect the various signals on each layer to connector portions 100A and 100B and to each other. It is also noted that each of circuit boards 10 and 15 may be any type of circuit board such as a printed circuit board, for example. It is further noted that in another embodiment, the board contacts 111 of connector portion 100A may be mounted using pins which protrude down through vias in circuit board 10. Likewise, board contacts 161 of connector portion 100B may also be mounted using pins which protrude down through vias in circuit board 15. In such an embodiment, the pins may be soldered or pressure fitted to circuit boards 10 and 15, respectively.

Figure 2:
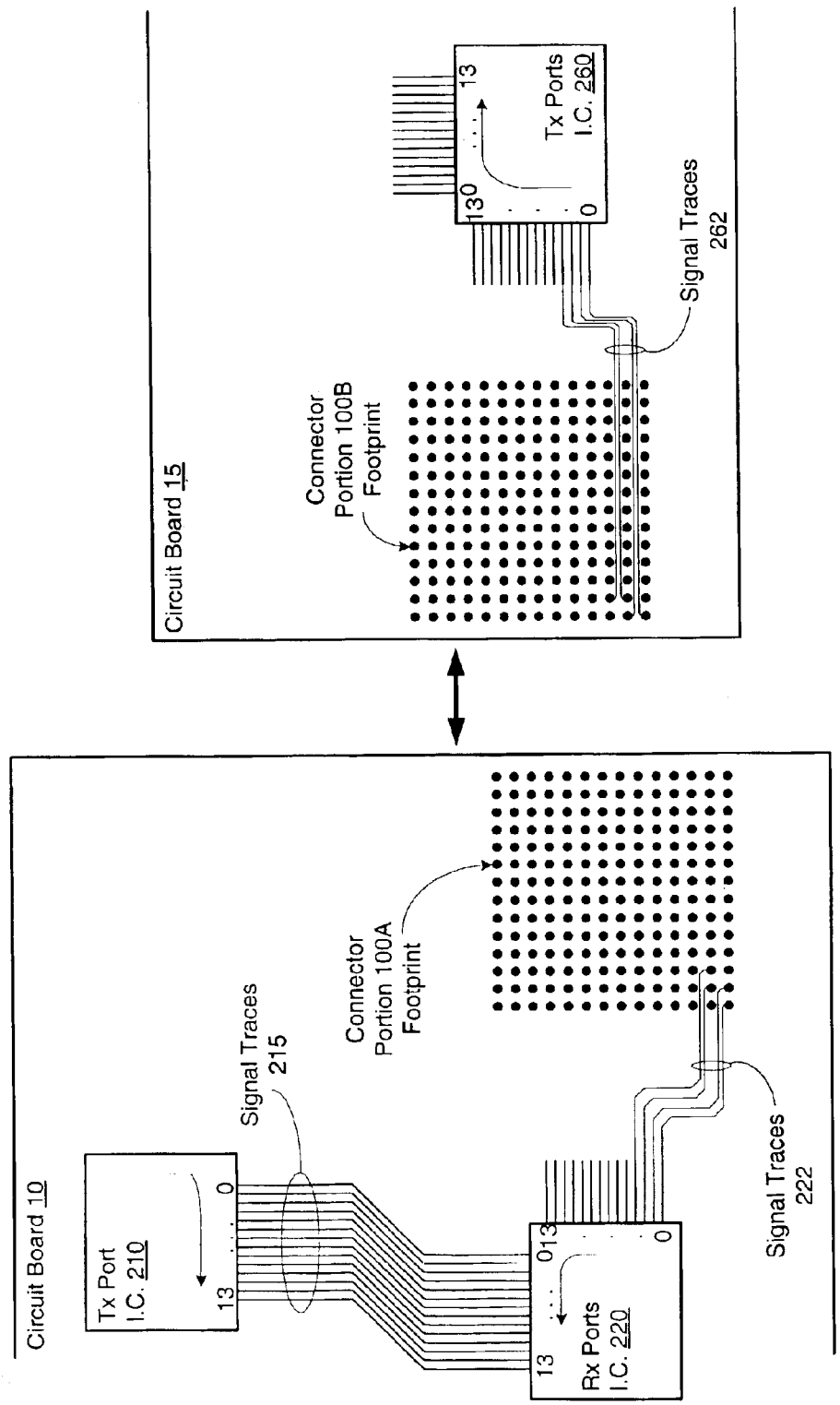
FIG. 2 is a top view diagram of the circuit boards of FIG. 1.

Referring to FIG. 2, a top view diagram of the circuit boards of FIG. 1 is shown. Circuit components that correspond to those shown in FIG. 1 are numbered identically for clarity and simplicity. Circuit board 10 includes an integrated circuit chip (I.C.) 210 having a transmit (Tx) port including 14 output pins. Circuit board 10 also includes an IC 220 shown having two receive (Rx) ports having 14 input pins. Circuit board 15 includes an IC 260 also having two transmit port each having 14 input pins. In addition, circuit board 15 includes a connector portion 100B. It is noted that although each IC is shown having only receive or transmit ports, it is contemplated that any IC may have both receive and transmit ports.

The output pins of IC 210 are designated 0–13. Each group of 14 pins is referred to as a link. In one embodiment, a link may include 14 related signals including 12 signals, such as data for example, and a pair of differential clock signals. One of the links is shown routed from IC 210 to IC 220 by signal traces 215. It is noted that while only four signals are shown coupled to connector portion 100A footprint for simplicity, it is contemplated that the remaining signals may be coupled to connector portion 100A footprint. The Tx port is shown numbered in a clockwise order around the periphery of IC 210, while the Rx ports are shown numbered in a counter-clockwise order around the periphery of IC 220. In addition, a second link of IC 220 is coupled to a connector portion 100A by additional signal traces 222. One of the Rx port links of IC 260 is also coupled to connector portion 1001B by signal traces 262. As will be described further below in conjunction with FIG. 3 and FIGS. 4A–B, the ordering of the signals from the Tx port of IC 260 to the Rx port of IC 220 may be kept intact and routed with no twisting or criss-crossing.

In one embodiment, each link may be a source synchronous link. For example, each link may include a different pair of complementary clock signals and a set of signals that are driven by or associated with that pair of clock signals. Thus, it may be desirable to have the clock signals experience substantially the same loading as the associated signals within any given link. Therefore, each link may be routed such that the lead lengths and signal environments of each of the 14 signals within a link may be kept as close to the same as possible. In addition, it may be advantageous not to twist or crisscross any of the 14 signals thus keeping the relative signal order within a link intact. Due to component and trace density on circuit board 10 and 15, the above may be achieved by limiting the number of links routed on any one layer. These link requirements or specifications may improve signal integrity. In one embodiment, two links may be routed on some selected layers, while one link may be routed on certain other layers.

As mentioned above, each of signal traces 222 are coupled to a connection point on the surface of circuit board 10 which may be coupled to the board contacts of connector portion 100A. The connection points may be signal pads which may be in contact with vias. In one embodiment, the various signal traces may be routed directly to a via such as a through-hole via (described below). In other embodiments, the signal traces may be routed to signal pads used for soldering the board contacts of connector portion 100A. In such an embodiment, some signal pads may be coupled to vias for connection to other layers of circuit board 10. The same is true for circuit board 15 and connector portion 100B.

Generally speaking, a circuit board has connection areas called pads on the surface of the top layer for soldering a connector portion such as connector portion 100A or 100B, for example. The pads are typically arranged in a pattern that matches a connector's board contact pattern, the pattern may also be known as a footprint. This footprint is sometimes duplicated on the bottom surface layer directly opposite the top layer. For multiple layer boards, the footprint may be duplicated on each layer. It is noted that although the footprints shown in FIG. 2 are 14 by 14 squares, it is contemplated that other embodiments may have footprints having other shapes and other numbers of contacts.

Signal traces and signal planes may connect the pads to power, ground, each other and various circuit connections that may populate a circuit board. Since there are often more traces needed than can be manufactured on a single layer, traces may be placed on various internal layers. To connect the various internal layer traces to each other and to the surface layers, metal plated connections may be used. These connections are called vias. Depending on whether the connector uses a surface-mount or a through-hole solder connection, one of two types of vias may be commonly used: Plated through-hole vias and blind vias.

Plated through-hole vias are holes drilled completely through all layers of the circuit board and perpendicular to the surface. The holes are then plated with a conducting metal, such as copper or gold. Through-hole vias can therefore connect signals on any layer to any other layer. Blind vias are holes drilled from one surface through some of the internal layers and then plated with a conducting metal. Therefore, blind vias can connect signals on the surface layer to any internal layers through which it passes. It is contemplated that circuit boards 10 and 15 may use either type solder connection and therefore either type of via and corresponding footprint may be used.

As described above, the links may need to be routed on a circuit board in a particular way to preserve signal integrity. In addition, if a link is routed from one circuit board to another (e.g. circuit board 10 to circuit board 15), through a connector such as connector 100, for example, the same link specifications described above may be employed. As will be described further below in conjunction with the description of FIG. 3, a pin assignment of the board contacts of connector portions 100A and 100B may be used to route the links through connector 100. The pin assignments used in FIG. 3 may be particularly useful when orienting circuit board 10 orthogonally with respect to circuit board 15 as shown in FIG. 1.

Figure 3:
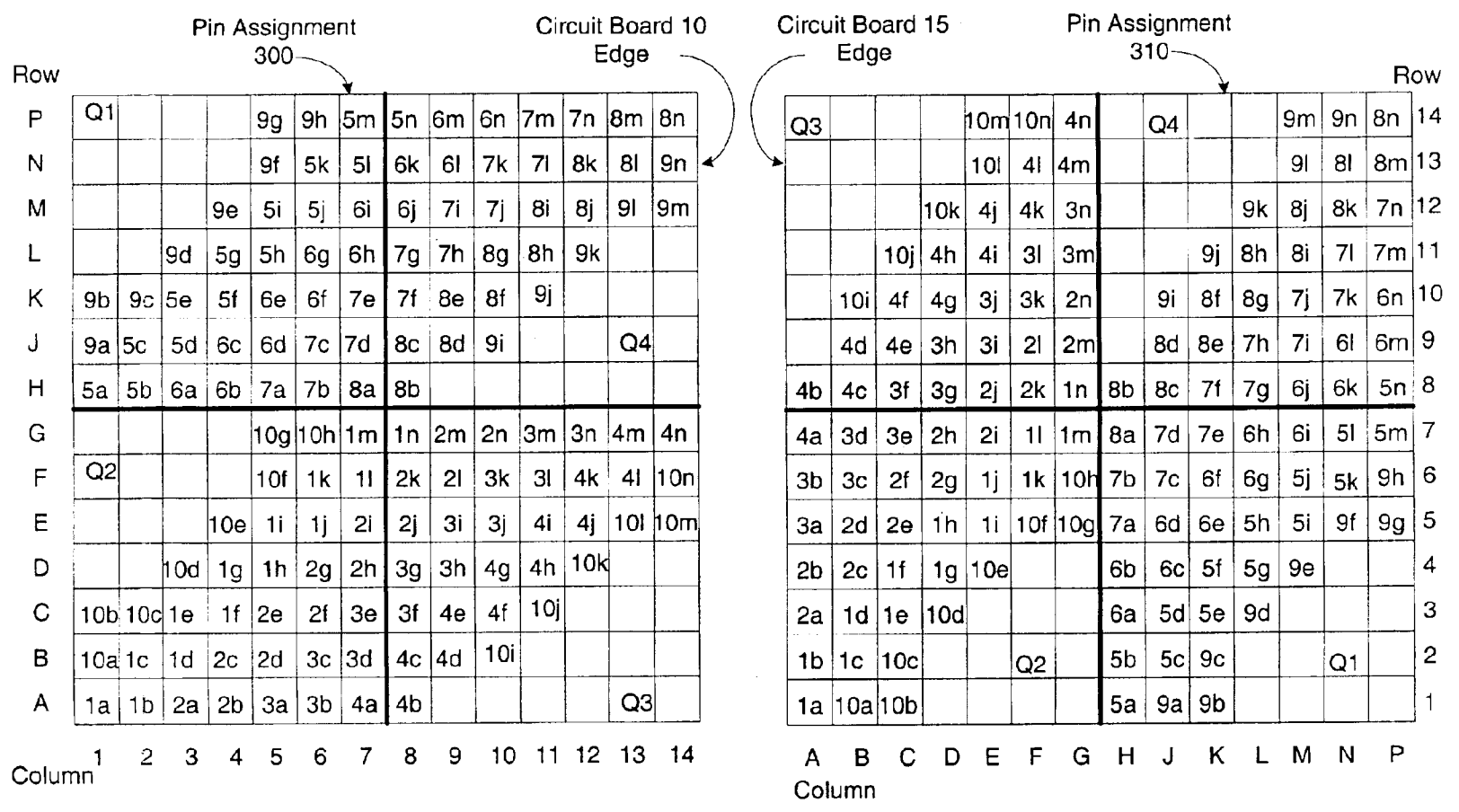

FIG. 3 illustrates a diagram of one embodiment of pin assignments for the board contacts of connector portions 100A and 100B of connector 100 of FIG. 1. The array on the left is designated Pin Assignment 300 and corresponds to the pin assignments of the board contacts on circuit board 10 of FIG. 1 and FIG. 2. The array on the right is designated Pin Assignment 310 and corresponds to the pin assignments of the board contacts on circuit board 15 of FIG. 1 and FIG. 2. Further, the arrays are shown such that the circuit boards are oriented edge to edge.

Each square within both arrays represents one connector to board connection. The alphanumeric value within the squares represents the link number and the signal within each link, where the links are represented by numbers and the fourteen signals within each link are represented by letters. For example in Pin Assignment 300, at row P column 5 is the alphanumeric value '9g'. The number 9 represents link number 9 and the 'g' represents the $7^{th}$ signal within link 9. It is noted that not all connections in the array are used. In the illustrated embodiment there are ten links routed through connector 100. Although other embodiments are contemplated having other numbers of links. For example, an alternative embodiment may include twelve links.

In Pin Assignment 300, the rows of the array are designated with letters and the columns are designated using numbers. Although this is an arbitrary designation, it may be used to contrast the row/column designations used in Pin Assignment 310, which are the transpose of the row/column designations in Pin Assignment 300. Thus, in the illustrated embodiment the rows are transposed into columns and the columns are transposed into rows as the signals are routed from one circuit board to the other through connector 100. For example, the pin assignment '9g' at row P column 5 in Pin Assignment 300 corresponds to (i.e. is electrically coupled to) the '9g' at row 5 column P of Pin Assignment 310 when the two connector portions are mated. As described above, these particular pin assignments are made to provide signal integrity particularly when circuit board 10 is oriented orthogonally with respect to circuit board 15 when mated using connector 100.

In addition, as illustrated in each pin assignment of FIG. 3, the connections for the links are grouped together in diagonal arrangements such that the signals in one link are contiguously diagonally oriented. Also, Pin Assignment 300 and 310 may each be divided into four quadrants as delineated by the thick lines and designated Q1–Q4. By arranging the quadrants as shown, the signal lead lengths within a given link may be kept approximately the same, relative to each other, when routed through connector 100. For example, the signal length from connection '1a' in Pin Assignment 300 to connection '1a' in Pin Assignment 310 is approximately the same as the signal length from connection '1m' in Pin Assignment 300 to connection '1m' in Pin Assignment 310. The same may be true of the other connections within each link. By using the illustrated diagonal assignments, the signals may be routed on the circuit boards without twisting or crisscrossing the signals within a link. Further, as will be described further below, the diagonal grouping arrangements of the board contacts may provide routing space for the signal traces of one or more links per circuit board layer that are coupled to each board connection pad on circuit boards 10 and 15.

Figures 4A, 4B:
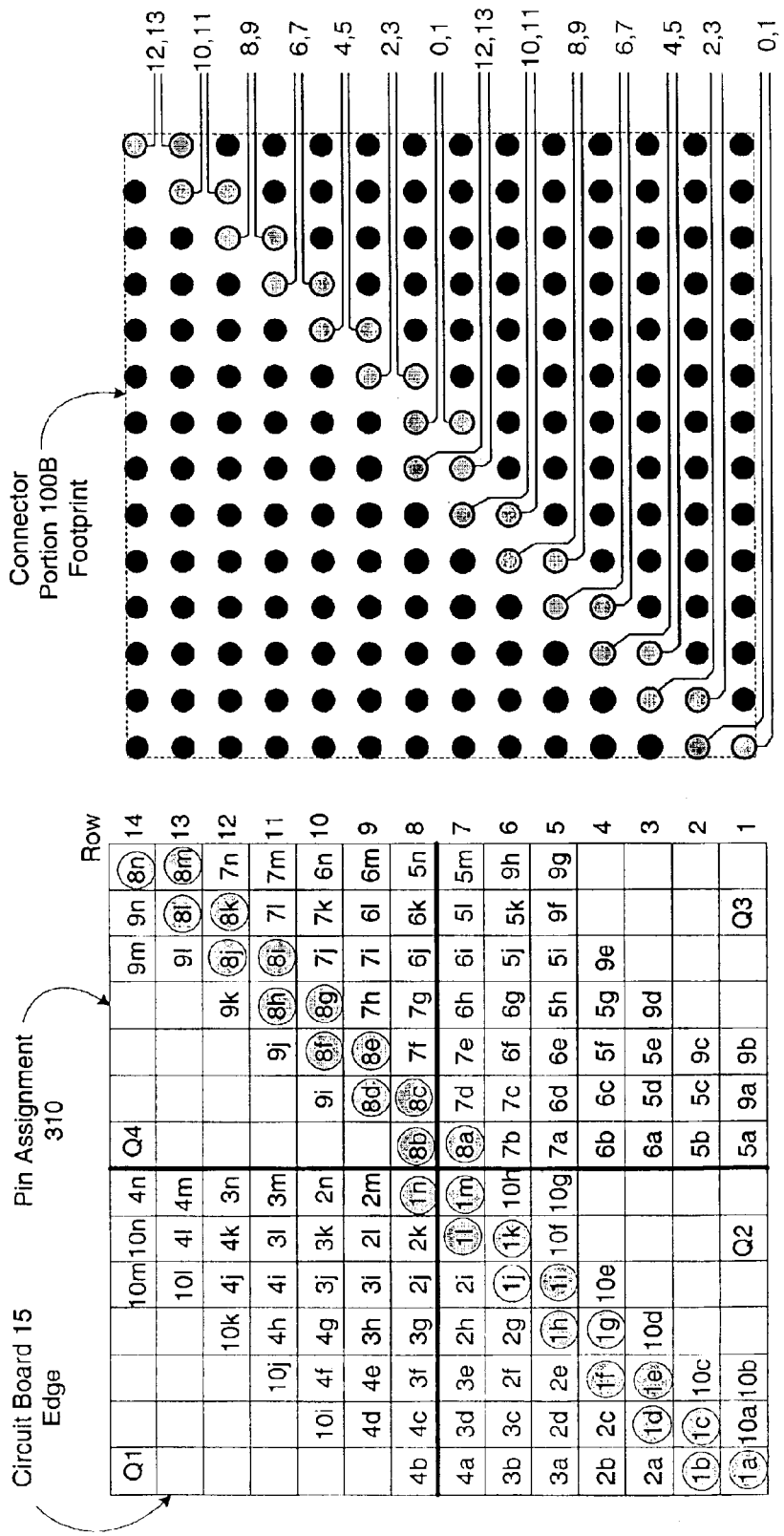
FIG. 4A is a diagram of one embodiment of the pin assignment of connector portion 100B of FIG. 1 and FIG. 2.
FIG. 4B is a diagram of one embodiment of a footprint of the board contacts of connector portion 100B.

FIG. 4A and FIG. 4B illustrate one embodiment of a pin assignment and footprint of connector portion 100B of FIG. 2 and FIG. 3. It is noted that only the pin assignment and footprint of connector portion 100B is described in conjunction with FIGS. 4A and 4B. It is contemplated that the pin assignment and footprint of connector portion 100A may be substantially the same as described in conjunction with FIG. 3 and thus not described for brevity and simplicity.

Turning to FIG. 4A, a diagram of one embodiment of the pin assignment connector portion 100B is shown. As described above, one or more links may be routed on one layer of circuit board 10 and 15. Thus, to illustrate by example, link number 1 and link number 8 are shown grouped together for routing on one layer of circuit board 15. It is noted that other embodiments may group other link numbers together or may have a single link routed on a given circuit board layer.

Referring to FIG. 4B, a diagram of one embodiment of a footprint of the board contacts of connector portion 100B is shown. The grouping of link number 1 and link number 8 are shown being routed from the footprint of connector portion 100B. The signals are ordered and routed without twisting. It is noted that other embodiments are contemplated that use other routings.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An electrical connector for conveying signals between a first circuit board and a second circuit board, said electrical connector comprising:
   a first connector portion including a first array of board contacts for connection to a first corresponding footprint on said first circuit board; and
   a second connector portion including a second array of board contacts for connection to a second corresponding footprint on said second circuit board;
   wherein when said first connector portion and said second connector portion are mated, each board contact of said first array is electrically coupled to a corresponding board contact in a transposed location in said second array such that each board contact in each row of said first array corresponds to a respective board contact in a respective column of said second array.

2. The connector as recited in claim 1, wherein said first connector portion and said second connector portion are configured to be detachably mated to each other such that when mated, said first circuit board is positioned edge to edge in a substantially orthogonal orientation with respect to said second circuit board.

3. The connector as recited in claim 1, wherein said first connector portion and said second connector portion are configured to convey a plurality of signal groups each including a plurality of signals.

4. The connector as recited in claim 3, wherein said plurality of signal groups includes 10 signal groups each including 14 signals.

5. The connector as recited in claim 3, wherein said plurality of signal groups includes 12 signal groups each including 14 signals.

6. The connector as recited in claim 1, wherein said first connector portion is mounted along an edge of said first circuit board and said second connector portion is mounted along an edge of said second circuit board.

7. An electrical connector for conveying signals between a first circuit board and a second circuit board, said electrical connector comprising:
   a first connector portion including a first array of board contacts for connection to a first corresponding footprint on said first circuit board; and
   a second connector portion including a second array of board contacts for connection to a second corresponding footprint on said second circuit board;
   wherein said signals include a plurality of signal groups each including a different plurality of related signals, wherein each of said plurality of signal groups is assigned to a grouping of related board contacts of said first array of board contacts and to a corresponding grouping of related board contacts of said second array of board contacts; and
   wherein when said first connector portion and said second connector portion are mated, each grouping of related board contacts of said first array is electrically coupled to said corresponding grouping of related board contacts in a transposed location in said second array such that each board contact in each row of said first array corresponds to a respective board contact in a respective column of said second array.

8. The connector as recited in claim 7, wherein said first connector portion and said second connector portion are configured to be detachably mated to each other such that when mated, said first circuit board is positioned edge to edge in a substantially orthogonal orientation with respect to said second circuit board.

9. The connector as recited in claim 7, wherein said first array of board contacts and said second array of board contacts are arranged to provide a substantially equal signal length for each of said related signals within a given one of said plurality of signal groups.

10. The connector as recited in claim 7, wherein said first connector portion and said second connector portion are configured to convey 10 signal groups each including 14 related signals.

11. The connector as recited in claim 7, wherein said first connector portion and said second connector portion are configured to convey 12 signal groups each including 14 related signals.

12. The connector as recited in claim 7, wherein said first connector portion is mounted along an edge of said first circuit board and said second connector portion is mounted along an edge of said second circuit board.

13. The connector as recited in claim 7, wherein each of said signal groups includes a different pair of complementary clock signals and twelve associated signals.

14. The connector as recited in claim 7, wherein said plurality of different signals is arranged contiguously in an increasing order on said diagonal.

15. The connector as recited in claim 7, wherein when mated, said first connector portion and said second connector portion are configured to convey one or more of said plurality of signal groups from a single layer of said first circuit board to a corresponding single layer of said second circuit board while preserving an order of said plurality of related signals within a given one of said plurality of signal groups.

16. The connector as recited in claim 15, wherein each grouping of board contacts of said first array and each corresponding grouping in said second array are arranged diagonally.

17. The connector as recited in claim 16, wherein a given diagonal grouping of board contacts of said first array is transposed relative to a corresponding diagonal grouping of board contacts of said second array.

18. A system for conveying signals between circuit boards comprising:
  a first circuit board including:
    a first connector portion including a first array of board contacts for connection to a first corresponding footprint on said first circuit board; and
    a first integrated circuit configured to transmit a first grouping of source synchronous signals and a second grouping of source synchronous signals;
    wherein said first grouping of source synchronous signals is assigned to a first grouping of related board contacts of said first array of board contacts and said second grouping of source synchronous signals is assigned to a second grouping of related board contacts of said first array of board contacts;
  a second circuit board including:
    a second connector portion including a second array of board contacts for connection to a second corresponding footprint on said second circuit board; and
    a second integrated circuit configured to receive said first grouping of source synchronous signals and said second grouping of source synchronous signals;
  wherein when said first connector portion and said second connector portion are mated, said first grouping of related board contacts and said second grouping of related board contacts of said first array are electrically coupled to a corresponding first grouping of related board contacts and a corresponding second grouping of related board contacts in a transposed location in said second array.

19. The system as recited in claim 18, wherein said first connector portion and said second connector portion are configured to be detachably mated to each other such that when mated, said first circuit board is positioned edge to edge in a substantially orthogonal orientation with respect to said second circuit board.

20. The system as recited in claim 18, wherein said first array of board contacts and said second array of board contacts are assigned to provide a substantially equal signal length for each signal within said first grouping of source synchronous signals and for each signal within said second grouping of source synchronous signals.

21. The system as recited in claim 18, wherein when mated, said first connector portion and said second connector portion are configured to convey at least said first grouping of source synchronous signals from a single layer of said first circuit board to a corresponding single layer of said second circuit board while preserving a signal order of within at least said first grouping of source synchronous signals.

* * * * *